United States Patent [19]

Sangawa

[11] Patent Number: 4,756,186

[45] Date of Patent: Jul. 12, 1988

[54] INPUT/OUTPUT SIGNAL CHECKER FOR AN ELECTRONIC CONTROL UNIT IN AN ELECTRONICALLY CONTROLLED FUEL INJECTION SYSTEM

[75] Inventor: Shuhei Sangawa, Asaka, Japan

[73] Assignee: Honda Giken Kogyo Kabushiki Kaisha, Tokyo, Japan

[21] Appl. No.: 93,132

[22] Filed: Sep. 3, 1987

Related U.S. Application Data

[63] Continuation of Ser. No. 807,870, Dec. 11, 1985, abandoned.

[30] Foreign Application Priority Data

Dec. 14, 1984 [JP] Japan .................................. 59-262928

[51] Int. Cl.⁴ ........................................... G01M 15/00
[52] U.S. Cl. ................................................ 73/119 A
[58] Field of Search ............. 73/119 A, 118; 364/550, 364/551; 324/395

[56] References Cited

U.S. PATENT DOCUMENTS

| | | | |
|---|---|---|---|
| 2,126,342 | 8/1938 | Nippert | 73/118 |
| 3,521,157 | 7/1970 | Robertson | 324/395 |
| 3,697,865 | 10/1972 | Smith et al. | 73/118 |
| 3,763,420 | 10/1973 | Maisonville | 73/118 |
| 3,875,792 | 4/1975 | Krohn et al. | 73/119 A |
| 3,964,302 | 6/1976 | Gordon et al. | 73/117.3 |
| 4,030,351 | 6/1977 | Smith | 73/118 |
| 4,246,556 | 1/1981 | Endo et al. | 73/119 A |
| 4,325,251 | 4/1982 | Kanegae | 73/119 A |
| 4,502,438 | 3/1985 | Yasuhara | 73/119 A |
| 4,518,268 | 5/1985 | Swis et al. | 73/116 |
| 4,527,424 | 7/1985 | Takahashi | 73/119 A |
| 4,546,647 | 10/1985 | Takahashi | 73/118 |
| 4,551,801 | 11/1985 | Sokol | 364/551 |
| 4,567,756 | 2/1986 | Colborn | 73/118 |

FOREIGN PATENT DOCUMENTS

| | | | |
|---|---|---|---|
| 0182354 | 9/1985 | Japan | 73/119 A |
| 2019585 | 10/1979 | United Kingdom | 73/118 |

Primary Examiner—Stewart J. Levy
Assistant Examiner—Robert R. Raevis
Attorney, Agent, or Firm—Lyon & Lyon

[57] ABSTRACT

A checker for checking a plurality of input signals including signals representing operation parameters of a multi-cylinder internal combustion engine, the input signals being supplied to an electronic control unit for electronically controlling the operation of the engine, and a plurality of output signals outputted from the electronic control unit in response to the input signals. The checker has displays which display the respective input signals and output signals in respective modes. A display hold circuit is connected with a display to have a received signal in the display continuously over a desired time period. A frequency divider circuit is connected with an operation sequence display for displaying operation sequence of fuel injection valves and divides the frequency of the signal representing the operation sequence in a predetermined ratio and then delivers the frequency divided signal to the operation sequence display.

4 Claims, 6 Drawing Sheets

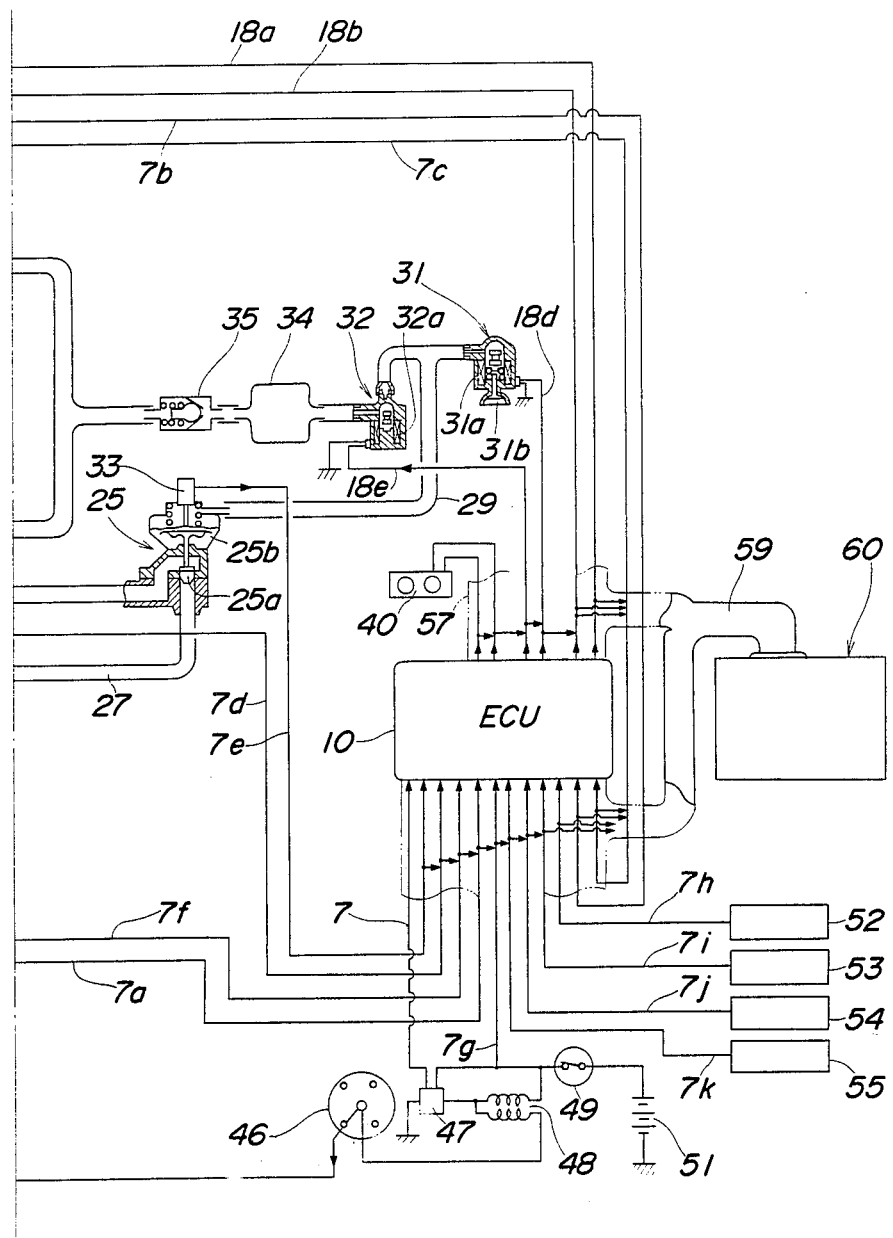

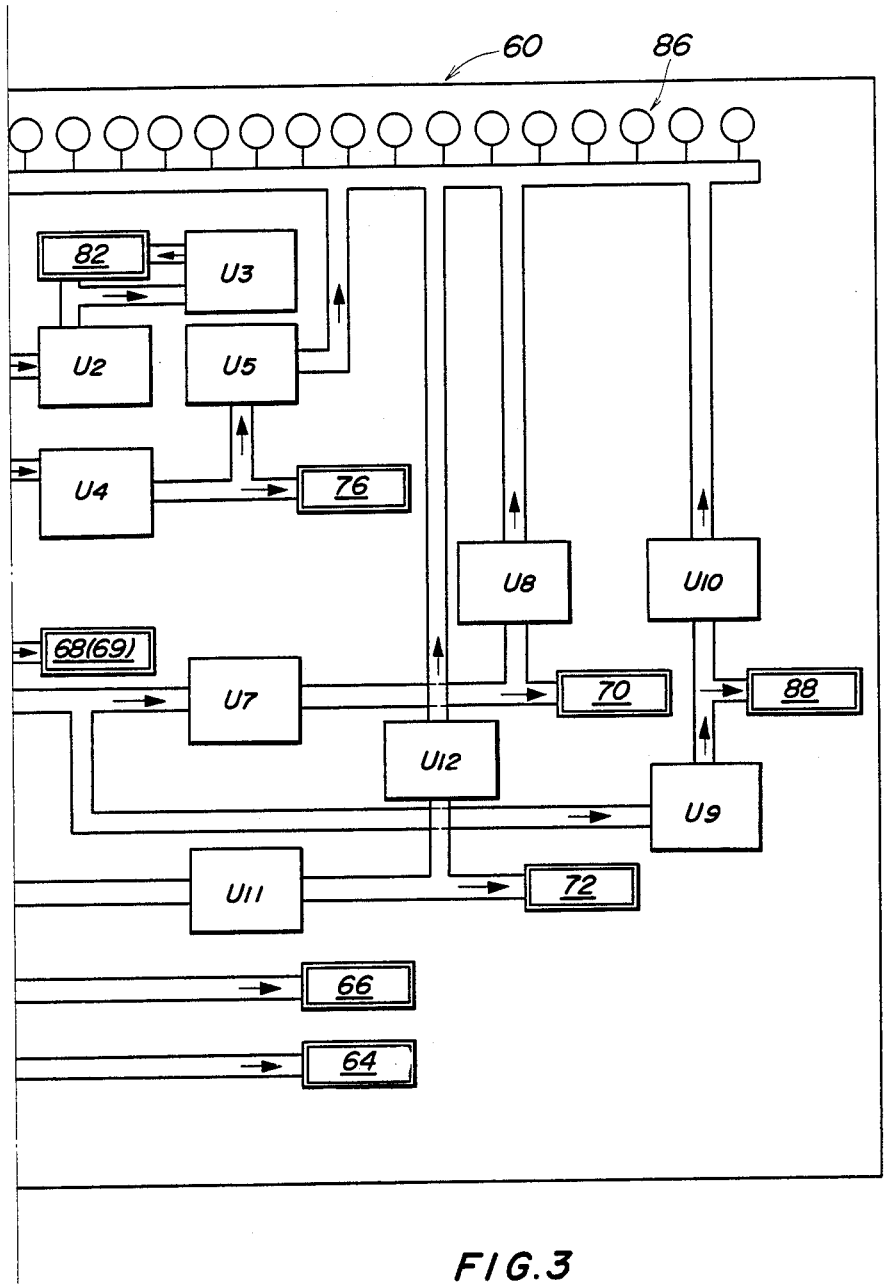

INPUT/OUTPUT SIGNAL CHECKER FOR AN ELECTRONIC CONTROL UNIT IN AN ELECTRONICALLY CONTROLLED FUEL INJECTION SYSTEM

This application is a continuation, of application Ser. No. 807,870, filed Dec. 11, 1985, now abandoned.

BACKGROUND OF THE INVENTION

This invention relates to an input/output-signal checker for an electronic control unit in an electronically controlled fuel injection system for internal combustion engines, and more particularly to a checker of this kind which is capable of easily monitoring a plurality of input signals and a plurality of output signals, and also capable of promptly detecting and locating an abnormality and analyzing its cause.

Electronically controlled fuel injection systems in general for an internal combustion engine for vehicles are provided with an electronic control unit, which is supplied with various signals as input signals such as those representing engine operational parameters detected of engine rotational speed, absolute pressure in the intake pipe, engine coolant temperature, the throttle valve opening, and exhaust gas component concentration (e.g. oxygen concentration), to calculate the valve opening periods of fuel injection valves in response to these input signals, such that the air/fuel ratio of the mixture gas supplied to the engine becomes desired values appropriate to operating conditions of the engine, and also to supply driving signals corresponding to the calculated valve opening periods to the fuel injection valves. Through this control it is sought to improve engine performance and emission characteristics.

When some abnormality such as engine disorder occurs in a vehicle equipped with such an elecronically controlled fuel injection system as explained above, it is necessary to determine whether the abnormality is attributable to the electronic control unit itself, or input signals, or fuel injection valves, in order to find out the cause.

Conventionally, as inspection means to this purpose, a plurality of measuring instruments have been adopted, e.g. a synchroscope or an ammeter to inspect whether or not correct valve opening period signals are outputted from the electronic control unit, ordinary instruments such as a circuit tester to inspect the internal circuitry of the electronic control unit, and instruments to individually inspect such items as the interior of the other devices and the output signals therefrom. However, the electronic control unit is supplied with input signals of various engine operational parameters detected, and outputs valve opening period signals in response to these input signals. Therefore, the use of a plurality of instruments to individually inspect the electronic control unit itself and the input and output systems has made the inspection work too complicated and time-consuming.

SUMMARY OF THE INVENTION

It is the object of the invention to provide an input/output-signal checker for an electronic control unit in an electronically controlled fuel injection system which enables the operator to easily read the states of a plurality of input signals and a plurality of output signals, etc. at the same time to thereby enable him to promptly and accurately detect, locate, and analyze an abnormality when it occurs.

According to the invention, a checker is provided for an electronic control means, which electronically controls the operation of an internal combustion engine having a plurality of cylinders and as many fuel injection valves provided, respectively, for the cylinders, the checker being adapted to check a plurality of input signals including signals representing operation parameters of the engine and being supplied to the electronic control means, and a plurality of output signals including signals representing the valve opening periods of the fuel injection valves and being produced and outputted by the electronic control means in response to the input signals.

The checker according to the invention comprises: display means for displaying the input signals and the output signals in respective predetermined modes, the display means including an operation sequence display for displaying operation sequence of the fuel injection valves in which they are opened; display hold means connected to the display means for having the display means continuously display a signal received thereby; and frequency dividing means connected to the operation sequence display for dividing the frequency of a signal representing the operation sequence of the fuel injection valves in a predetermined ratio and delivering the frequency divided signal to the operation sequence display.

The above and other objects, features and advantages of the invention will be more apparent from the ensuing detailed description taken in conjunction with the accompanying drawings.

BRIEF DESCRIPTION OF THE DRAWINGS

FIGS. 1A and 1B show the whole arrangement of an electronically controlled fuel injection system to which the input/output-signal checker according to the invention is applicable and FIG. 1 shows the relationship between FIGS. 1A and 1B.

FIGS. 3A and 3B comprise a block diagram schematically illustrating the internal arrangement of the input/output-signal checker of FIG. 2 and FIG. 3 shows the relationship between FIGS. 3A and 3B.

DETAILED DESCRIPTION

The invention will now be described in detail with reference to the drawings showing an embodiment thereof.

Figure 1A:
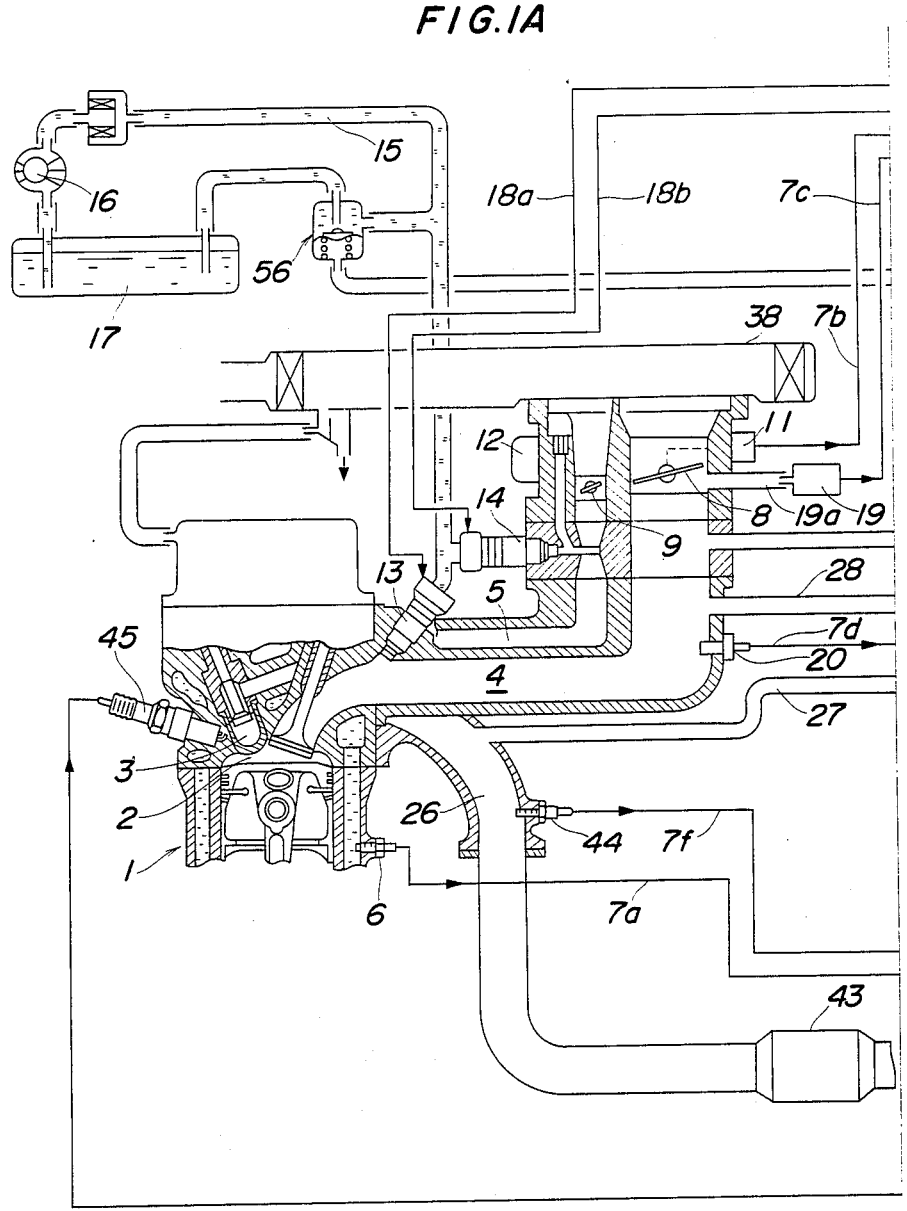

Referring first to FIGS. 1, 1A and 1B, reference numeral 1 designates an internal combustion engine for vehicles which may be a four-cylinder type, for instance. This engine 1 has a plurality of main combustion chambers 2 (which may be four, only one of which is shown) and as many sub combustion chambers 3 communicating with the respective main chambers 2. A main intake pipe 4 communicates with each main combustion chamber 2, and a sub intake pipe 5 with each sub combustion chamber 3. The interior of the peripheral wall of each engine cylinder is filled with cooling water, in which is inserted an engine water temperature sensor 6 formed of a thermistor or the like. An output signal of the engine water temperature sensor 6 is supplied to an electronic control unit (hereinafter called "the ECU") 10 via a line 7a. A main throttle valve 8 and a sub throttle valve 9 are arranged, respectively, in the main intake pipe 4 and the sub intake pipe 5. A throttle valve opening sensor 11 is connected to the main throttle valve 8 for detecting its valve opening to convert same into an electrical signal which is supplied to the ECU 10 via a line 7b. Reference numeral 12 designates a fast idle device, which is connected to the ECU 10 via a driving signal line (not shown) and adapted to open the main throttle valve 8 at and after the start of the engine.

A main fuel injection valve 13 is provided for each engine cylinder and arranged in the main intake pipe 4 at a location slightly upstream of the engine 1, while a single sub fuel injection valve 14 is provided for common use with all the engine cylinders and arranged in the sub intake pipe 5 at a location slightly downstream of the sub throttle valve 9. These fuel injection valves 13, 14 are connected to a fuel tank 17 by way of a common conduit 15 and a fuel pump 16. These fuel injection valves 13, 14 are electrically connected to the ECU 10 via respective lines 18a and 18b, so as to have their valve opening periods controlled by signals supplied from the ECU 10.

On the other hand, an absolute pressure sensor 19 is connected to the main intake pipe 4 via a conduit 19a at a location immediately downstream of the main throttle valve 8. The absolute pressure sensor 19 is adapted to detect and convert absolute pressure in the intake pipe 4 to supply to the ECU 10 via a line 7c.

Inserted into the main intake pipe 4 at a location downstream of the absolute pressure sensor 19 is an intake air temperature sensor 20 which is also arranged to detect the intake air temperature and convert the detected intake air temperature signal into an electrical signal to supply to the ECU 10 via a line 7d.

Reference numeral 25 designates an exhaust gas recirculation valve, which is a negative pressure-actuated type valve and formed of a valve body 25a disposed to establish and interrupt communication of a conduit 27 leading to the exhaust pipe 26 of the engine 1 with a conduit 28 leading to the main intake pipe 4, and a diaphragm 25b in contact with the valve body 25a. A negative pressure chamber defined by the diaphragm 25b, communicates with a pair of EGR control valves 31, 32 by way of a conduit 29. A lift sensor 33 is mounted on an end of the valve body 25a of the exhaust gas recirculation valve 25, which is adapted to convert the operating position of the valve body 25a into an electrical signal and supply the same signal to the ECU 10 via a line 7e. The EGR control valve 31 is of normally open type and operates such that its solenoid 31a is energized by an electrical signal supplied from the ECU 10 to allow the conduit 29 to communicate with the atmosphere through its air intake port 31b for introduction of atmospheric pressure into the negative pressure chamber of the exhaust gas recirculation valve 25. The other EGR control valve 32 is of normally closed type and operates such that its solenoid 32a is energized by an electrical signal supplied from the ECU 10 via a line 18e to allow the conduit 29 to communicate with an accumulator tank 34. The accumulator tank 34 stores absolute pressure supplied from the main intake pipe 4 through a check valve 35 and, therefore, when the EGR control valve 32 is opened, the stored absolute pressure is introduced into the negative pressure chamber of the exhaust gas recirculation valve 25.

An $O_2$ sensor 44 forming an exhaust gas sensor is embedded in the inner wall of the exhaust pipe 26 at a location upstream of a three-way catalyst 43, for detecting the concentration of oxygen present in the exhaust gases. The $O_2$ sensor 44 supplies its output signal to the ECU 10 via a line 7f.

Incidentally, in FIGS. 1A and 1B, reference numeral 40 designates a speedometer, 45 an ignition plug, 46 a distributor, 47 an electronic timing control unit for the distributor 46, 48 an ignition coil, 49 an ignition switch, and 51 a battery. The voltage of the battery 51, when the ignition switch 49 is closed, is delivered to the ECU 10 via a line 7g. Further, reference numeral 52 indicates an engine crank angle position sensor adapted to generate one pulse at a particular crank angle each time the engine crank shaft rotates through 180 degrees, i.e. upon generation of each pulse of the TDC signal, 53 a cylinder-discriminating sensor adapted to generate one pulse at a particular crank angle of a first engine cylinder, 54 an atmospheric pressure sensor for converting actual atmospheric pressure into an electrical signal, and 55 a crank angle sensor adapted to generate pulses at a plurality of predetermined engine crank angles as crank angle signals, each pulse being generated each time the crank shaft rotates through a predetermined angle (e.g. 30 degrees). The output signals from these sensors 52, 53, 54, and 55 are delivered to the ECU 10 via respective lines 7h, 7i, 7j, and 7k. Reference numeral 56 designates a pressure-regulating valve for regulating the injection fuel pressure.

The ECU 10 operates to calculate the valve opening periods of the fuel injection valves 13, 14 in response to the output signals from various engine operation parameter sensors as mentioned above, such that the air/fuel ratio of the mixture gas supplied to the engine becomes equal to values appropriate to operating conditions of the engine, and also to supply driving signals corresponding to the calculated valve opening periods to the fuel injection valves 13, 14 to open same.

Figure 2:
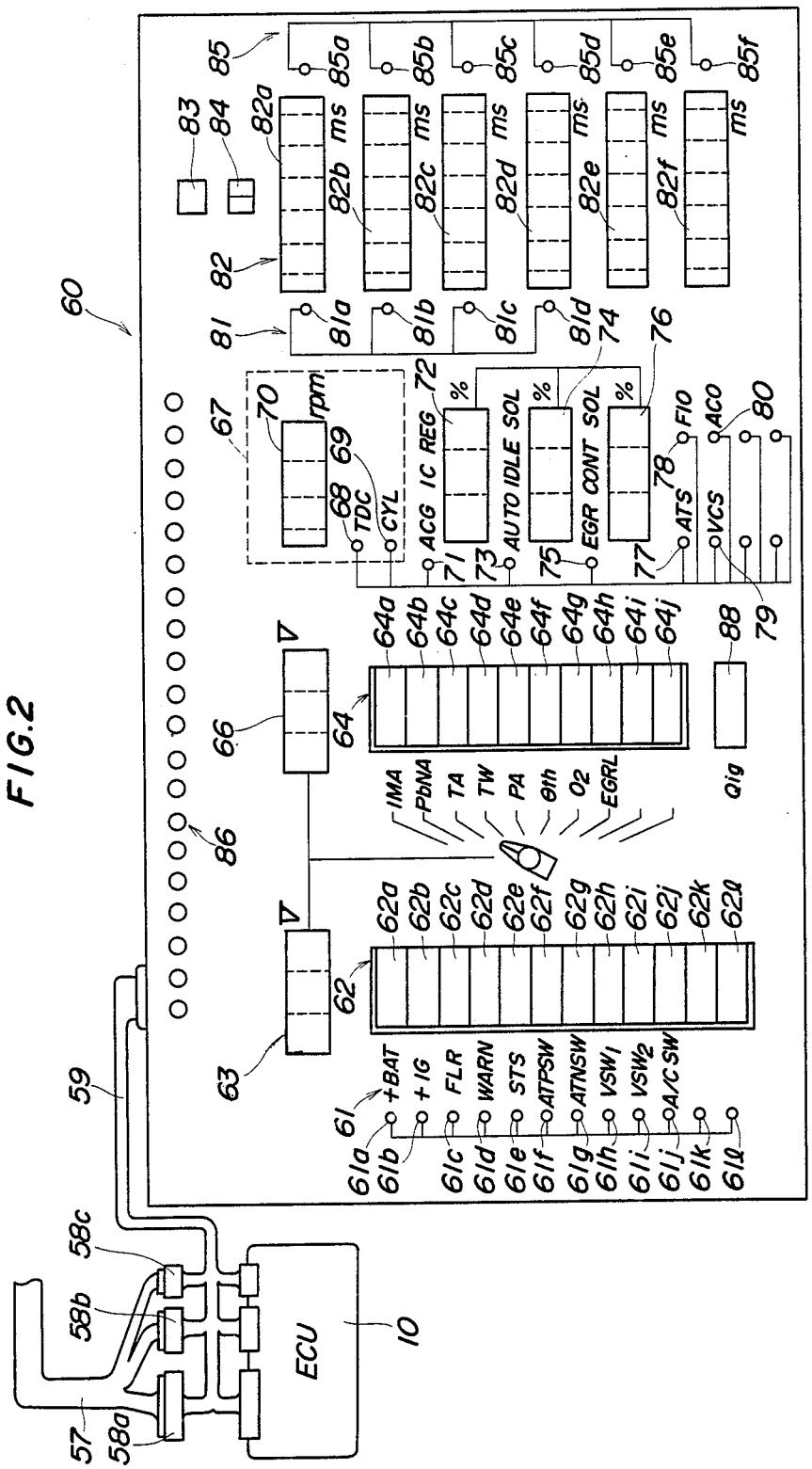
FIG. 2 is a front view of the input/output-signal checker, with a front panel shown in detail, according to an embodiment of the invenion.
Figure 3A:
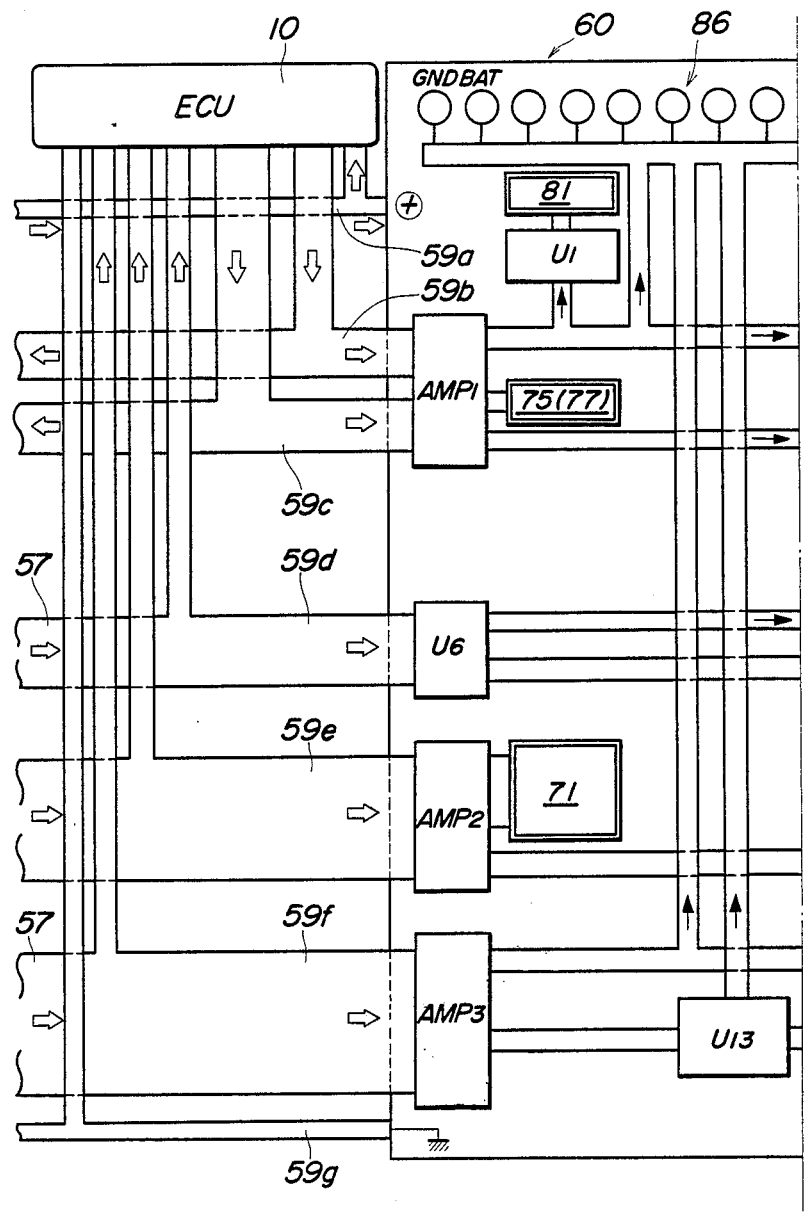

The checker according to this invention is intended to check signals inputted to and signals outputted from the ECU 10 of an electronically controlled fuel injection system of the kind described above. The details of the checker is shown in FIGS. 2, 3A and 3B. As shown in FIG. 2, a harness 57 comprising the lines 7a through 7k, wherethrough signals from the various sensors are inputted to the ECU 10, and the lines 18a through 18f, wherethrough signals are outputted to the fuel injection valves 13, 14, etc. from the ECU 10, diverges into a plurality of harnesses, three in this embodiment, by way of respective couplers 58a, 58b, and 58c. A branch harness 59, which branches off from each of the plurality of harnesses, is connected to the checker 60.

A multiplicity of displays or readouts are provided on the front panel of the checker 60 for displaying signals inputted to and signals outputted from the ECU 10 in respective predetermined modes. The displays depicted in a circle in FIG. 2 are each formed of an indicator lamp, e.g. an LED (light emitting diode), to indicate ON/OFF state of its signal.

Reference numeral 61 designates an ON/OFF display block, which indicates ON/OFF states of input and output signals. This display block 61 comprises a plurality of displays 61a through 61l each formed of an LED, which turn on and off to indicate the ON/OFF states of the respective input and output signals. Further, the displays 61a through 61l are paired with respective comment displays 62a through 62l, which indicate the contents of the respective signals. For example, a battery power display designated by reference numeral 61a is paired with a comment display 62a, which indicates in simple code or language whether or not the battery voltage is above a predetermined value. Reference numeral 61b designates a display of supply voltage for the ignition device, 61c a display of driving signal for a relay for driving the fuel pump, 61d a display of ON/OFF signal from an exhaust gas temperature alarming lamp, 61e a starter switch signal display, 61f a display of ON/OFF signal from a neutral position switch of the automatic transmission, and 61g a display of ON/OFF signal from a parking position switch of the automatic transmission. Reference numerals 61h and 61i designate displays of ON/OFF signals from vehicle speed signal switches, the displays 61h and 61i being provided on the speedometer 40. Reference numeral 61j designates an airconditioner switch signal display. Specially provided for the battery, which acts as the power source for various devices, is a battery voltage display 63 for indication of the battery voltage, in addition to the displays 61a and 62a.

Arranged adjacent to the ON/OFF signal display blocks 61 through 63 on the front panel are diplay blocks 64 and 66 for indication of inputting of output signals from various sensors. The display block 64 directly indicates the physical values per se of parameters such as temperatures and pressures detected by the respective sensors, whereas the voltage display 66 indicates these detected physical values in terms of voltage. The physical value display block 64 comprises a display 64a of output signal from an initial air/fuel ratio sensor (not shown in FIGS. 1, 1A and 1B), a display 64b of main intake pipe absolute pressure signal from the absolute pressure sensor 19, a display 64c of intake air temperature signal from the intake air temperature sensor 20, a display 64d of engine water temperature signal from the engine water temperature sensor 6, a display 64e of atmospheric pressure signal from the atmospheric pressure sensor 54, a display 64f of throttle valve opening signal from the throttle valve opening sensor 11, a display 64g of oxygen concentration signal from the $O_2$ sensor 44, and a display of actual ignition timing signal. The physical value display block 64 is provided with a selector switch 65, which selects a signal from among input signals to indicate at the voltage display 66 the voltage of the selected signal outputted from the corresponding sensor as well as to indicate the physical value per se thereof at the corresponding one of displays 64a through 64j. For example, when the atmospheric pressure signal is selected, the display 64e may indicate "760 mmHg" while the display 66 indicates a voltage value corresponding to the atmopsheric pressure, e.g. "2.88 V".

Reference numeral 67 designates an engine rotation display block. Provided in this display block 67 are a TDC signal input display 68 to indicate the ON/OFF states of TDC signal inputted from the engine crank angle position sensor 52, a cylinder-discriminating signal input display 69 to indicate the ON/OFF states of cylinder-discriminating signal inputted from the cylinder-discriminating sensor 53, and also an engine rotational speed display 70 to indicate engine rotational speed, which is calculated from the above two input signals as described later.

Reference numeral 71 designates a regulator signal input display to indicate the ON/OFF states of IC regulator signal inputted from the AC generator of the engine, and 72 a generating condition display to indicate the generating condition of the AC generator in terms of duty factor. The generating condition display 72 indicates the generating condition in terms of the rate of energization or duty factor of the field winding of the AC generator, in other words, it indicates the loaded condition of the AC generator.

Reference numeral 73 designates an auto idle solenoid energization display to indicate the ON/OFF states of driving signal for an auto idle solenoid (not shown). The auto idle solenoid forms a part of a device which maintains the idle rotational speed at a constant value by adjusting the cross-sectional area of a supplementary air passage bypassing the throttle valve 8 at engine idling. Reference numeral 74 designates a display to indicate driving pulse signal for the auto idle solenoid in terms of duty factor.

Reference numeral 75 denotes an EGR control signal display, which indicates the ON/OFF state of driving signal outputted from the EGR control valve solenoid 32a (FIG. 1B), and 76 a display to indicate in terms of duty factor a pulse signal for control of the EGR control valve 32.

Reference numeral 77 designates an automatic transmission solenoid signal display to indicate the ON/OFF states of driving signal for a solenoid (not shown) for the automatic transmission of the engine, 78 a display to indicate the ON/OFF states of driving signal for the fast idle solenoid in the fast idle device 12 shown in FIG. 1A, 79 a display to indicate the ON/OFF states of driving signal for a vacuum control solenoid in a vacuum advancer for control of the ignition timing, and 80 a display to indicate the ON/OFF states of driving signal for an air conditioner opener solenoid (not shown). The automatic transmission solenoid is a supplementary air flow rate control valve which is energized to open to supply the engine with supplementary air at engine idle operation when the automatic transmission is shifted to its reverse (R) or drive (D) position to thereby stabilize the engine idle rotational speed. Also, the air conditioner opener is a supplementary air flow rate control valve which is energized to open to supply the engine with supplementary air upon actuation of the air conditioner to thereby increase the engine output in response to increased engine load.

Reference numeral 81 designates a display block, comprising four LED's 81a through 81d corresponding, respectively, to the four fuel injection valves 13 provided for the respective cylinders, shown in FIG. 1A, to indicate the operation sequence of the fuel injection valves 13. The lighting sequence of the LED's 81a through 81d corresponds to the actual operation sequence of the fuel injection valves 13. However, the operation cycle of the fuel injection valves is so short that it is practically impossible to check their operation sequence by observing with the eye the LED's 81a through 81d if the latter are turned on and off in direct response to the operation cycle. Therefore, as will be described later, the display block 81 is provided with a frequency divider, which divides the frequency of driving signals for the fuel injection valves 13 in a predetermined ratio, whereby the operation sequence of the fuel injection valves is indicated by the displays at a reduced frequency for easier visual observation thereof. Reference numeral 82 designates a valve opening period display block, which numerically indicates the valve opening periods of the fuel injection valves 13 in terms of milliseconds. This display block 82 comprises six displays 82a through 82f (so that it may also serve for six-cylinder engines) corresponding to respective fuel injection valves 13. The display block 82 is provided with holding means to facilitate reading of the values indicated by the displays. Reference numeral 83 designates a push button for actuating the holding means.

There is provided another display block 85, comprising six LED's 85a through 85f, which correspond, respectively, to the six displays 82a through 82f, so that the checker 60 may be applied to an engine with six cylinders as well as to one with four cylinders. For the selection between the 4-cylinder mode and the 6-cylinder mode, there is provided a selector switch 84.

Reference numeral 86 designates terminals for outputting analog amounts of respective input and output signals. These terminals 86 are provided for the purpose of enabling data recorders and the like to record the respective states of the input and output signals as of the time of occurrence of abnormality in the engine operating conditions, etc., to facilitate analysis of the abnormality.

Incidentally, the input/output ON/OFF signal display block 61 is also provided with blank displays 61k and 61l, which may be also used depending upon specifications of a fuel injection control device applied, which requires more displays. For the same purpose, the physical value display block 64 also has blank displays 64i and 64j.

Referring now to FIGS. 3A and 3B the internal arrangement of the checker 60 will be described. Connected to the input side of the checker 60 are a plurality of input lines and harnesses 59a through 59g. For instance, the line 59a is a feeder connected to a power supply formed of a battery, not shown, mounted in a vehicle applied, and the line 59g is an earthing line.

Reference numerals 59b and 59c respectively designate harnesses for supplying respective ON/OFF driving signals outputted from the ECU 10 for the fuel injection valves 13 and solenoids such as the auto idle solenoid. These driving signals are amplified by a current amplifier group $AMP_1$ to a required current level. Among these driving signals, the driving signal for the EGR control solenoid 32a is delivered to the display 75 directly from the current amplifier group $AMP_1$. The driving signals for the fuel injection valves 13 from the current amplifier group $AMP_1$ have their frequencies divided by a frequency divider $U_1$ with a dividing ratio of 8, so that their new frequencies are one eighth of the original ones. Then the driving signals are indicated by the operation sequence display block 81 as the operation sequence signals of the fuel injection valves 13.

Figure 4:
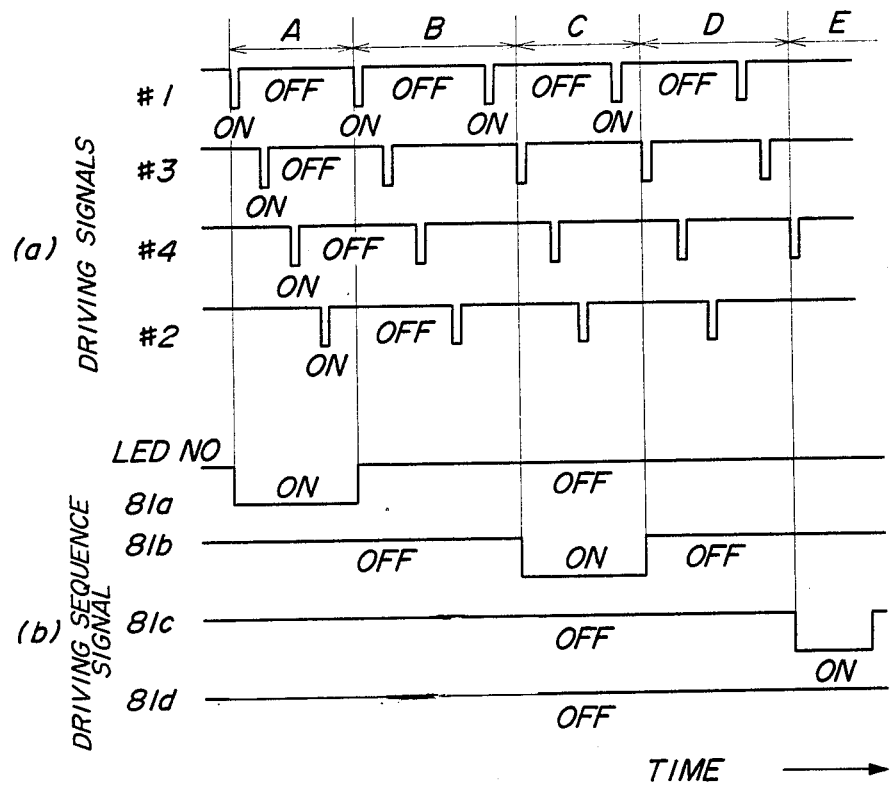
FIG. 4 is a timing chart showing the operation of a frequency divider in the checker.

FIG. 4 is a timing chart showing the operation of the frequency divider $U_1$. In response to inputting of sequential driving signals for fuel injection valves shown at (a) in FIG. 4, the frequency divider $U_1$ outputs operation sequence signals shown at (b) in FIG. 4 to indicate operation sequence at the display block 81 (81a through 81d). As is seen from FIG. 4, during the time span A when the fuel injection valves #1, #3, #4, and #2, corresponding to the respective four cylinders of the engine, are each opened once in this order, the LED 81a turns on and is maintained in ON state throughout the span A. During the next span B when the four fuel injection valves are each opened once, none of LED's 81 turns on. In this way, during the time span C the LED 81b turns on, and none does during the span D, and then the LED 81c turns on during the span E. Hence, each time the four fuel injection valves 13 are opened thirty-two times in total, the four LED's turn on four times in total.

Referring again to FIGS. 3A and 3B, the valve opening period signals for fuel injection valves 13 from the current amplifier group $AMP_1$ are counted by a counter $U_2$, and the count values are indicated by the valve opening period display block 82. As described earlier, a signal holding circuit (the holding means) $U_3$ is provided to facilitate reading of the valve opening periods indicated by the display block 82. The valve opening period display block 82 indicates count values supplied one after another from the counter $U_2$. When the push button 83 in FIG. 2 is pressed, the signal holding circuit $U_3$ is actuated to cause the display block 82 to continuously indicate a count value supplied at the time the push button 83 is pressed. When the push button 82 is released, the hold mode is cancelled to cause the display block 82 to start indicating subsequent count values again one after another as they are supplied.

The pulse signal for EGR control from the current amplifier group $AMP_1$ has its ON time ratio or duty factor calculated by a calculator circuit $U_4$, and the pulse signal outputted from the calculator circuit $U_4$ is indicated by the display 76 in terms of duty factor. Incidentally, the driving signal for the auto idle solenoid has its ON time ratio calculated in a calculator circuit (not shown), and the result is indicated in terms of duty factor by the display 74. Further, the pulse signal for EGR control has its duty factor converted to a required voltage level by a level shifter $U_5$, and is delivered to one of the analog amount outputting terminals 86.

Reference numeral 59d designates a harness for supplying to the ECU 10 pulse signals indicating the TDC signal, the cylinder-discriminating signal, and the crank angle position signal. These signals have their pulse waveforms shaped by a waveform shaper group $U_6$, from which the shaped TDC signal and cylinder-discriminating signal are delivered to the respective displays 68, 69. Further, the TDC signal and the cylinder-discriminating signal are fed to a pulse interval/rotation calculator circuit $U_7$, which calculates the engine rotational speed from the TDC signal and the cylinder-discriminating signal to indicate the result on the engine rotational speed display 70. The engine rotational speed signal from the circuit $U_7$ is also fed to a rotational speed/voltage converter circuit $U_8$, which converts the rotational speed into an analog value to supply the latter to one of the analog amount outputting terminals 86. On the other hand, the crank angle position signal from the waveform shaper group $U_6$ is supplied to an ignition timing calculator circuit $U_9$, which calculates the ignition timing based on the crank angle position signal and the ignition timing signal, the latter being supplied from an ignition timing control device (not shown), to indicate the result on the ignition timing display 88. Further, the calculated ignition timing is converted into analog value by an ignition timing/voltage converter circuit $U_{10}$ and is then applied to one of the analog amount outputting terminals 86.

Reference numeral 59e designates a harness for supplying an IC regulator signal from the AC generator. The IC regulator signal is amplified by a current amplifier $AMP_2$ to a required current level, and the amplified signal is directly delivered to the ON/OFF display 71, while at the same time it is delivered via an ON time ratio calculator circuit $U_{11}$ to the duty factor display 72 to be indicated in terms of duty factor. The same duty factor is converted into a corresponding voltage value by a duty factor/voltage converter circuit $U_{12}$, and is delivered to one of the analog amount outputting terminal 86.

Reference numeral 59f designates a harness for supplying to the ECU 10 signals indicative of of physical quantities such as the intake pipe absolute pressure and the engine water temperature. In the same way as described above, these signals have their current values amplified by a current amplifier group $AMP_3$ to a required current level and are delivered from the current amplifier group $AMP_3$ to the voltage value display 66 via the selector switch 65. These signals are also delivered to the physical value display block 64 from the current amplifier group $AMP_3$ via a voltage/physical quantity converter circuit $U_{13}$. Incidentally, although in FIG. 2 the calculator circuits $U_4$, $U_7$, $U_9$, $U_{13}$, etc. are indicated in the form of discrete blocks so that the function of the checker 60 can be understood better, these circuits may be replaced by a single microcomputor.

Now, the operation of the checker 60 will be described.

When the engine 1 is started and the electronically controlled fuel injection system starts to control the air/fuel ratio, those input signals to be inputted to the ECU 10 such as the intake pipe absolute pressure singal, the engine water temperature signal, the oxygen concentration signal, the TDC signal, and the cylinder-discriminating signal, and those outputted signals to be outputted, in response to the above-mentioned input signals, from the ECU 10 such as the valve opening period signal for the fuel injection valves 13 and the driving signals for various solenoids are indicated simultaneously by the respective LED displays on the front panel of the checker 60 in predetermined modes, i.e. in terms of ON/OFF, duty factor, and physical quantity. The contents of signals that are important for engine operation, such as that of the battery voltage, are also indicated. Therefore, during normal engine operation the operator will be informed from the indications that the engine is in a normal operating condition.

If some abnormality occurs in the engine operating conditions, the location of the abnormality is easily detected from the contents indicated of input and output signals. In particular, since the driving signals for the respective fuel injection valves 13 are indicated as operation sequence signals after their frequencies have been divided by the frequency divider $U_1$ with a predetermined ratio, their operation sequence can easily be monitored. Also, it is possible to positively read the valve opening period of each fuel injection valve 13 by pressing the push button 83 to maintain on the display the indication of the count value supplied at the time the push button 83 is pressed for a desired time period. When the location of the abnormality cannot be judged by merely observing the contents of the displays with the eye, it becomes possible to analyze the cause for and location of the abnormality by recording the analog values of input and/or output signals concerned in a data recorder or the like through analog amount outputting terminals 86, and then comparing them with each other.

To check the operation of the ECU 10 itself, the connection harnesses are removed from the vehicle at the couplers 58a through 58c, and a model signal generator (not shown) is connected to the ECU 10, to supply the ECU 10 with model signals with normal model values of intake pipe absolute pressure signal, engine water temperature signal, oxygen concentration signal, TDC signal, etc., and then the values of the valve opening period signal and other signals outputted from the ECU 10 in response to the inputted signals are examined. If the ECU 10 and the various sensors are normally operating, the output values from the ECU 10 should indicate respective proper predetermined values. provided that the input signals are of such values that satisfy certain conditions, and, therefore, by reading these output values indicated by the displays on the checker 60 it can be judged whether or not the ECU 10 and other items are normal.

In this way, the checker 60 enables prompt, simple, and accurate checking of the operation of the sensors as well as that of the ECU 10 itself.

What is claimed is:

1. A checker for an electronic control means, which electronically controls the operation of an internal combustion engine having a plurality of cylinders and as many fuel injection valves provided, respectively, for said cylinders, said checker being adapted to check a plurality of input signals including signals representing numerical quantities of operation parameters of said engine and being supplied to said electronic control means, and a plurality of output signals including signals representing numerical quantities of at least valve opening periods of said fuel injection valves and binary signals representing operation and non-operation of said fuel injection valves and being produced and outputted by said electronic control means in response to said input signals, said checker comprising:

a plurality of display means for always displaying information of said input signals and said output signals in respective predetermined modes irrespective of whether said information indicates normality or abnormality, said plurality of display means including an operation sequence display for displaying operation sequence of said fuel injection valves in which they are opened;

display hold means connected to at least one of said plurality of display means for having said at least one of said plurality of display means continuously display the information of at least one of said input and output signals representing numerical quantities received thereby; and frequency dividing means connected to said operation sequence display for dividing the frequency of said binary signals representing operation and non-operation of said fuel injection valves in such a predetermined ratio that visual observation of said operation sequence is facilitated and delivering the frequency divided signal to said operation sequence display.

2. A checker as claimed in claim 1 wherein said plurality of display means includes a valve opening period display for displaying information of said signals representing numerical quantities of said valve opening periods of said fuel injection valves, said display hold means being disposed to have said valve opening period display continuously display said information of said signals representing numerical quantities of said valve opening periods.

3. A checker as claimed in claim 1, wherein said signal representing operation sequence of said fuel injection valves comprises driving signals for said fuel injection valves.

4. A checker as claimed in claim 1, including a plurality of terminals associated respectively with at least part of said input and output signals for outputting analog amounts of respective ones of said at least part of said input and output signals, said terminals being connectable to external recording devices to output said respective ones of said at least part of said input and output signals to said external recording devices.

* * * * *

UNITED STATES PATENT AND TRADEMARK OFFICE
CERTIFICATE OF CORRECTION

PATENT NO. : 4,756,186

DATED : July 12, 1988

INVENTOR(S) : Shuhei Sangawa

It is certified that error appears in the above-identified patent and that said Letters Patent is hereby corrected as shown below:

TITLE PAGE:
In Item [56] References Cited: change "4,246,556" to --4,246,566--.

Signed and Sealed this

Twenty-third Day of April, 1991

Attest:

HARRY F. MANBECK, JR.

*Attesting Officer*  *Commissioner of Patents and Trademarks*